United States Patent [19]
Amoroso

[11] Patent Number: 5,436,973
[45] Date of Patent: Jul. 25, 1995

[54] PSEUDO-RANDOM SIGNAL SYNTHESIZER WITH SMOOTH, FLAT POWER SPECTRUM

[75] Inventor: Frank Amoroso, Santa Ana, Calif.

[73] Assignee: Hughes Aircraft Company, Los Angeles, Calif.

[21] Appl. No.: 191,451

[22] Filed: May 9, 1988

[51] Int. Cl.$^6$ ............................ H03B 29/00; G06F 1/02
[52] U.S. Cl. ........................................ 380/46; 375/200; 380/34; 364/717; 331/78
[58] Field of Search ...................... 375/1; 380/34, 46, ; 364/717; 331/78

[56] References Cited

U.S. PATENT DOCUMENTS

| | | | |
|---|---|---|---|
| 4,396,894 | 8/1983 | Willmore | 331/78 |
| 4,644,299 | 2/1987 | Amoroso et al. | 331/78 |
| 4,961,203 | 10/1990 | Maufe et al. | 375/1 |

*Primary Examiner*—Bernarr E. Gregory
*Attorney, Agent, or Firm*—W. K. Denson-Low

[57] ABSTRACT

Apparatus and a method are disclosed for synthesizing a pseudorandom communications signal having a smooth, flat, power spectrum. The system comprises frequency modulation circuitry for deriving a first analog signal from a digital encoding signal. The first analog signal is derived to have a substantially constant amplitude and a frequency varying in response to the amplitude of the digital encoding signal. Fourier transform circuitry is connected to the modulation circuitry and is operative to derive a second analog signal from the first analog signal. The resulting second analog signal is the fourier transform of the first analog signal, having a substantially constant power spectral density over the bandwidth of said second analog signal, and having an amplitude that varies in response to the amplitude of the digital encoding signal.

2 Claims, 2 Drawing Sheets

FREQUENCY DOMAIN TIME DOMAIN

IN-PHASE SIGNAL $S_I(t)$ $F(\omega) = \dfrac{d\Phi(\omega)}{2\pi d(\omega)}$

QUADRATURE SIGNAL $S_Q(t)$ $\Phi(\omega)$

SIGNAL ENVELOPE $S(t) = \sqrt{S_I^2(t) + S_Q^2(t)}$

PSEUDO-RANDOM SIGNAL SYNTHESIZER WITH SMOOTH, FLAT POWER SPECTRUM

BACKGROUND OF THE INVENTION

The present invention relates to communications and radar systems and, more particularly, to a method and apparatus for transmitting communications signals that are resistant to electronic interference.

All communications systems, civilian and military, must be able to operate in the crowded electromagnetic environment that results from the transmission of other radiation, both from the communicator's own band as well as from outside the bands. The communication link must be designed to reject those unwanted radiations and to minimize the likelihood of its own transmissions causing trouble to other users of the spectrum. Military communicators, however, must also operate in a hostile environment where they may be subjected to deliberate interference designed to degrade their performance. The various methods for interfering electronically with communications signals are called electronic countermeasures (ECM). Active ECM is sometimes referred to as jamming. The methods employed to combat ECM are called electronic counter-countermeasures (ECCM).

For example, jamming includes carrier wave (CW) jamming, broadband jamming, medium and fast sweep jamming, impulse jamming and short pulse jamming. Corresponding ECCM procedures have been developed to defend against each of those techniques.

Communications transmitters, receivers and processors are commonly constructed to permit the received signal to be distinguished from the jamming signal. Such distinctions between received signals and jamming signals may be effected by well known ECCM techniques in the construction of the transmitter, the antenna, the receiver and/or the data processor. Techniques such as direct sequence pseudonoise (DSPN) spread spectrum, frequency hopping, pulse compresssion, side lobe cancellation and others are commonly used to distinguish the received signal from one or more types of ECM interference.

In the constantly evolving and competing fields of ECM and ECCM it can be assumed that where an adversary is willing to pay the resultant price, sufficient ECM can be brought to bear against any single communication link to significantly reduce its effectiveness. The goal of ECCM is, therefore, not to attempt to assure communication system effectiveness in any environment, but to raise the cost of ECM to the point where it is prohibitive. In the process, ECCM techniques are intended to enable reliable communications despite any degradation caused by most hostile ECM. A more detailed discussion concerning the operation of ECM and ECCM is provided by Robert C. Dixon in "Spread Spectrum Systems" J. Wiley and Sons In relation to the broad class of ECCM systems, the present invention is directed to a technique for generating a novel type of communications signal to be transmitted, which facilitates detection and isolation of an ECM signal from the transmitted communications signal by the receiver. As further described and illustrated below, conventional direct sequence pseudonoise spread spectrum communications signals are characterized by a ragged power spectral density having a distinct main lobe and side lobes. That raggedness is attributable to factors including the intentional randomness of the pseudonoise spreading stream (often referred to as a key stream) creating the transmitted communications signal. The raggedness of the power spectral density of the communication signal facilitates ECM interference, i.e. it complicates any attempt by a receiver to discern the spectral characteristics of a jamming signal accompanying the received communications signal. That difficulty is particularly acute where the ECM signal is a narrow band jamming signal that falls within the frequency band of the communications signal. The present invention is directed to apparatus and a technique for operating on the pseudo-random data signal to create a communications signal characterized by a smooth power spectral density over the signal bandwidth, such that ECM signals are more readily identified and isolated from the communications signal. The invention may be used in conjunction with existing signal processing equipment and other contemporary ECCM techniques.

SUMMARY OF THE INVENTION

A method and apparatus are disclosed for synthesizing a pseudorandom communications signal having a smooth, flat, power spectrum. The system comprises frequency modulation circuitry for deriving a first analog signal from a digital encoding signal. The first analog signal; output from a voltage controlled oscillator, is derived to have a substantially constant amplitude and a frequency varying in response to the amplitude of the digital encoding signal. Fourier transform circuitry is connected to the frequency modulation circuitry and operative to derive a second analog signal from the first analog signal. The resulting second analog signal, i.e. the transmitted signal, is the fourier transform of the first analog signal, having a substantially constant power spectral density over the bandwidth of said second analog signal, and having an amplitude that varies in response to the amplitude of said digital encoding signal.

The second analog signal is derived to have noise-like amplitude characteristics which appear as thermal noise to an observer. The substantially flat power spectral density of the second analog signal further makes that signal difficult to detect by an observer. The encoding signal is preferably a digital encoding signal having an amplitude that varies between two amplitude limits and is substantially equally distributed between the two amplitude limits. The first analog signal frequency characteristics are similarly equally distributed such that the frequency varies between two frequency limits and is substantially equally distributed between those limits. The fourier transform circuitry is operative to delay the frequency components of its input signal by times corresponding to the instantaneous frequencies of the first analog signal. Accordingly, the substantially equal frequency distribution of said first analog signal produces a second analog signal having amplitude characteristics that are statistically stationary and resemble thermal noise.

DETAILED DESCRIPTION OF THE PRESENTLY PREFERRED EMBODIMENT

The detailed description set forth below in connection with the appended figures is intended merely as a description of the presently preferred embodiment of the invention, and is not intended to represent the only form in which the present invention may be constructed or utilized. The description sets forth the functions and sequence of events that are effected by the invention in connection with the illustrated embodiment. It is to be understood, however, that the same, or equivalent functions or sequences may be accomplished by different embodiments that are also intended to be encompassed within the spirit and scope of the invention.

Figure 1:
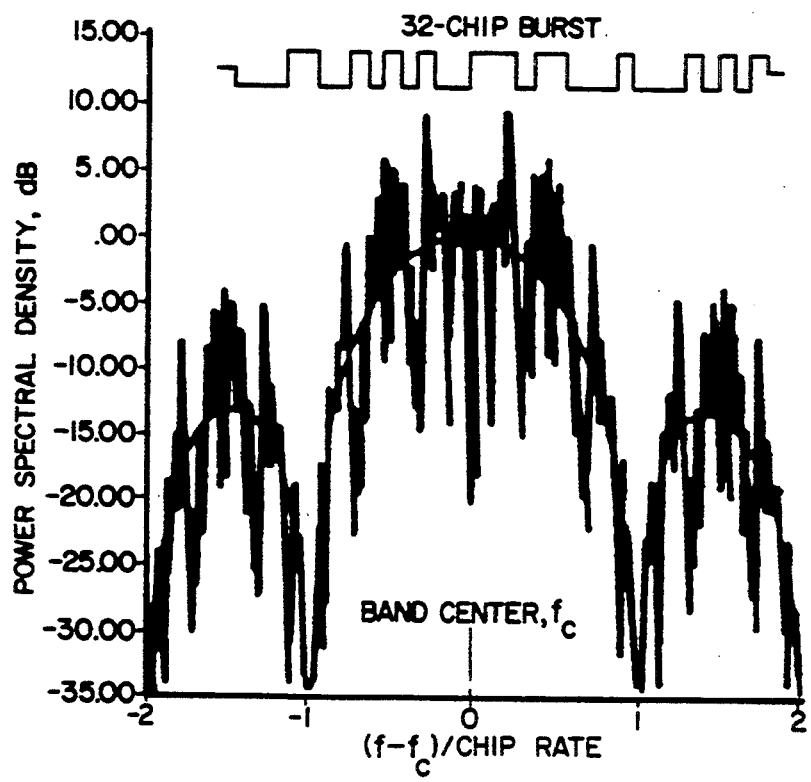
FIG. 1 is a graph showing the power spectral density of a conventional DSPN spread spectrum signal over the bandwidth of the signal.

Conventional frequency-hopped, direct sequence pseudonoise (FH-DSPN) systems may achieve wide bandwidth, frequency agility and spectral containment of the DSPN signal. However, they place a variety of requirements on signal synthesis. Spectral containment in such contemporary systems is typically realized through the use of complex frequency synthesizers, the versatility and flexiblity of which is limited. Additionally, such conventional systems produce DSPN signals that have ragged power spectral density characteristics resulting from the randomness of the pseudonoise (PN) data stream. FIG. 1 illustrates the power spectral density, at baseband, of a finite sample of a conventional thirty-two chip PN signal. The raggedness of the power spectral density is apparent from the figure. Any moderately powerful narrow band ECM jammer may generate signals that are easily confused with one of the peaks of the signal spectrum of the transmitted signal. Accordingly, it is desirable to generate a signal characterized by a more uniform power spectral density over the signal band, such that narrow band ECM interference signals may be more readily identified and segregated from the received communications signal.

Figure 2:
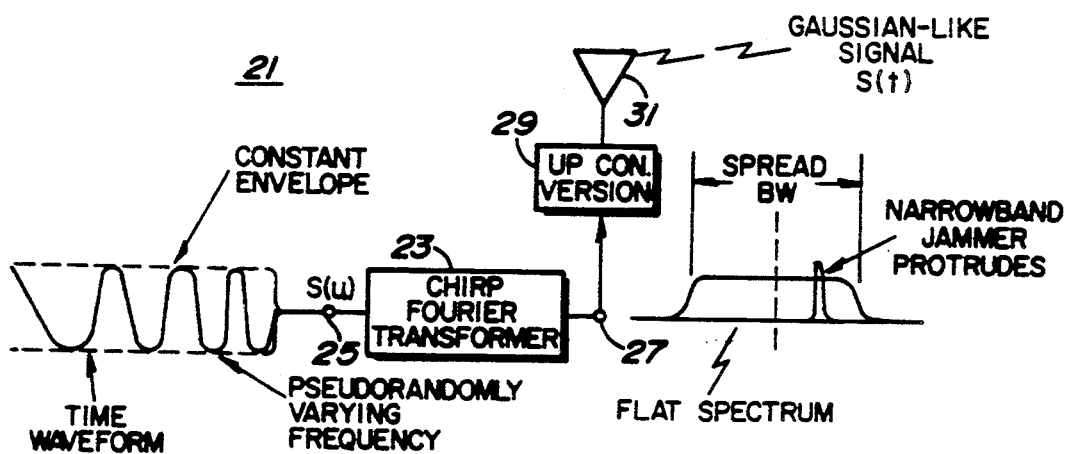
FIG. 2 is a block diagram illustrating implementation of the present invention along with respective input and output signals.

FIG. 2 is a block diagram illustrating implementation of the present invention along with a generalized representation of input and output signals. Circuit 21 includes chirp fourier transformer 23 implemented in accordance with the present invention. The input 25 to chirp fourier transformer 23 is identified as S(u), which is a time varying waveform characterized by a pseudo-randomly varying frequency, the amplitude of which remains constant within an envelope, The output 27 of chirp fourier transformer 23 is identified as S(t) which is also a time varying function. S(t) is passed through up conversion unit 29 and transmitted via antenna 31.

To give an adequate explanation of the operation of the circuit of FIG. 2 requires that "time" at the input of the chirp fourier transformer 23 be named differently from "time" at its output. Time at the input to the chirp fourier transformer 37 will be named u, while time at its output will be named t. Through the well known fourier transform relationship the variable u behaves like frequency as far as the time function at the output of the CFT 23 is concerned. Therefore u will be referred to as "pseudofrequency".

The signal S(u) may be characterized as a constant amplitude signal the frequency of which is equally distributed between two set limits. As described in more detail below the signal S(u) may be generated by a voltage controlled oscillator (VCO) and the two set limits may be established by conventional circuitry. The variations in frequency are responsive to a pseudo-random key stream which acts as the encoding signal. Chirp fourier transformer 23 is operative to predictably translate the variations in the frequency of the input signal S(u) into variations in the amplitude of the output signal S(t). The even distribution of the frequency of the input signal S(u) between the two limits produces an output signal S(t) that has a substantially constant average output signal power over its time span, with thermal noise-like peak amplitude characteristics. More specifically, the range of the variable (u) can be viewed as a plurality of signal spectral components arrayed along the horizontal axis, each of which is characterized by the substantially constant magnitude of S(u) and the frequency of S(u). The characteristic operation of fourier transformer 23 is to delay each of the spectral components (u) by a time proportional to the frequency of S(u) at that value of (u).

The spectral component of pseudofrequency u is delayed by an amount proportional to the VCO output frequency at that value of u due to subjecting s(u) to a fourier transform process. Assuming that such output frequencies are equally distributed between two frequency limits, the spectral components represented by values of u will be evenly distributed in time in the output signal of the chirp fourier transformer, thereby producing a substantially constant average output signal power with amplitude variations that are similar to thermal noise. Another useful characteristic of the chirp fourier transformer 23 is that, where the magnitude of the input signal remains constant, the power spectral density of the output will be substantially constant over the bandwidth of the output signal. That characteristic is used to obtain the flat power spectral density of the output signal, while allowing the frequency modulation inherent in S(u) to produce pseudo-random amplitude characteristics in S(t). According to well known properties of the fourier transform, the bandwidth of the output signal S(t) is determined by the duration of the pulse S(u).

The output signal S(t) is a combination of in-phase and quadrature signal components, the composite signal having an amplitude that varies in a manner resembling thermal noise. The flat power spectral density characteristics of the output signal S(t) further makes it difficult to detect the presence of the transmitted signal S(t). Unless the receiver is in synchronization with the pulse rate of the signal S(u), and can generate a key stream in conformance with the key stream utilized to vary the frequency of S(u), reception and interpretation of the transmitted signal is likely to be extremely difficult. Hence hostile interception is greatly complicated.

In practice, the signal S(u) may be viewed as a pseudo-random FM signal within a constant envelope. Circuitry suitable for generating such a signal is described in U.S. Pat. No. 4,697,157 for INHERENTLY FLAT SPECTRAL DENSITY PSEUDO-RANDOM NOISE GENERATOR, to Buddecke, et al. Alternate means such as described in U.S. Pat. No. 4,644,299, for MULTIMODE NOISE GENERATOR USING DIGITAL FM, to Amoroso can also be used to generate the signal S(u). The chirp fourier transformer 37 may also be constructed in accordance with known devices.

Chirp fourier transformer 23 may be implemented as a conventional device such as the SAW implementation of the chirp Z transform adapted to transform the rate of change of the phase of the input signal to a corresponding time delay in the output signal. Constant average signal power at the output of the chirp fourier transformer 23 is predicated upon an input signal having pseudorandom frequency characteristics with uniform distribution within the maximum and minimum frequency limits. The structure and operation of one such device is described by Rabiner, et al. in THE CHIRP z-TRANSFORM ALGORITHM, IEEE TRANSACTIONS ON AUDIO AND ELECTRO ACOUSTICS, vol. 17, no. 2, June 1969, pp. 86–92 and by L. B. Milstein, P. K. Das, AN ANALYSIS OF A REAL-TIME TRANSFORM DOMAIN FILTERING DIGITAL COMMUNICATION SYSTEM-PART I: NARROW-BAND INTERFERENCE REJECTION, IEEE TRANSACTIONS ON COMMUNICATIONS, vol. COM-28, no. 6, pp. 816–824, June 1980. A feature of the invention is the use of such a chirp fourier transformer in combination with the pseudo-noise (PN) stream in order to provide the desired communications signal characteristics, i.e. flat power spectral density and noise-like amplitude of the transmitted signal. Those characteristics render the transmitted signal less perceptible and less interceptable, as previously described. It has been determined that in practice the in-phase and quadrature components of the transmitted signal S(t) tend to be Gaussian shaped, and hence more resistant to electronic support measures (ESM) interception. The power spectral flatness has also been observed to yield a 2.1 dB advantage over minimum shift keying (MSK) signaling in a narrowband jamming environment.

As a consequence of the present invention the output signal S(t) has a wider bandwidth than would normally be expected to result from the same size pulse duration. The low level amplitude and wide bandwidth make the transmitted signal more difficult to detect by jamming equipment. The flat smooth power spectral density also facilitates discrimination of any jamming signal, as previously described. The instantaneous bandwidth of the transmitted signal may be modified in accordance with other conventional techniques to further reduce the susceptibility of the transmitted signal to ECM interference. Predistortion for equalization in the presence of known ECM interference is straight forward. Frequency agility and spectral shaping of the output signal may be accomplished by a stored function that represents the desired spectral shaping effected as a multiplier of S(u). Such may be used to reduce the effectiveness of a known jammer. Thus, the transform domain synthesis provides a versatile and flexible means for producing spread spectrum waveforms resistant to ECM interference.

Figure 3:
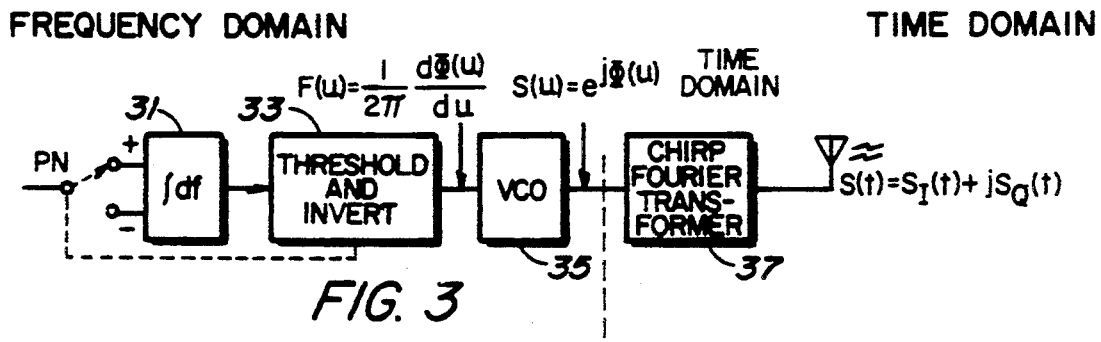
FIG. 3 is a block diagram illustrating implementation of the present invention in connection with associated circuitry for generating a suitable input signal.

FIG. 3 is a block diagram illustrating the present invention and setting forth in further detail structure and method useful to implement the present invention utilizing a conventional binary PN stream as the source of pseudo-randomness. As illustrated at FIG. 2, the input to the chirp fourier transformer 37 is identified as S(u), having a component of interest which is variable in response to the amplitude of the signal F(u). The signal F(u) is generated as a consequence of the operation of integrator 31 and threshold and inverter circuit 33. Implementation of integrator 31 and threshold and inverter circuitry 33 would be apparent to those of ordinary skill in the art in view of the particular application of interest. Suitable components to perform the function of integrator 31 threshold and invert circuitry 33 and voltage controlled oscillator (VCO) 35 are described in the aforementioned U.S. Pat. No. 4,697,157 to BUDDECKE.

The output of the VCO 35 is a sine wave of constant amplitude and of variable frequency under the control of the VCO input. VCO input frequency will be called F(u). Now through a well known fourier transform relationship the incidence of any time delay T at the CFT 37 output corresponds to the appearance of the multiplying factor $\exp(-2juT)$ at the CFT input. But the factor $\exp(-2juT)$ simply represents a sinusoid in the pseudofrequency variable u, that sinusoid having a frequency numerically equal to T. Therefore the frequency variable F(u) numerically represents time delay at the output of the CFT 37.

Figure 4A:
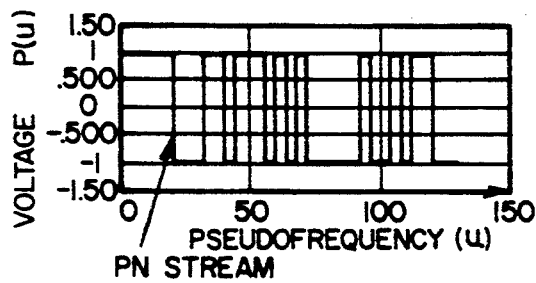
FIGS. 4a-f are signal diagrams illustrating signals and signal components at various locations within the circuit set forth at FIG. 3.
Figure 4D:
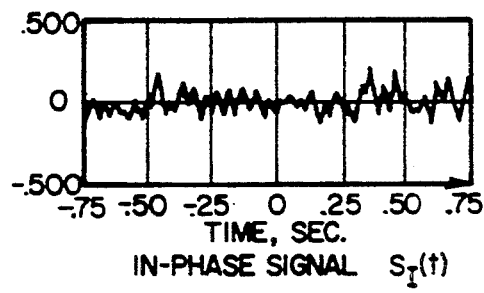
Figure 4B:
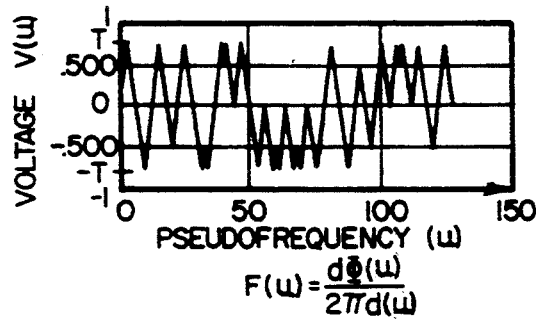

Accordingly, in FIG. 4b the vertical axis is dimensioned in units of time, as it represents the frequency F(u) at the VCO output. To help interpret FIG. 4b note that the horizontal line at F(u)=0.500 intersects the random sawtooth F(u) at a number of values of u. Those values represent the collection of signal spectral components which arrive at the CFT output at time t=0.50.

FIG. 4 graphically illustrates typical waveforms appearing at different locations within the exemplary circuitry set forth at FIG. 3, and, therefore, should be read in conjunction with FIG. 3 for better understanding of the illustrated implementation of the invention. FIG. 4a graphically illustrates an exemplary PN data stream input to the circuitry set forth at FIG. 3. FIG. 4b illustrates a frequency varying function F(u) derived from the PN input signal.

Figure 4E:
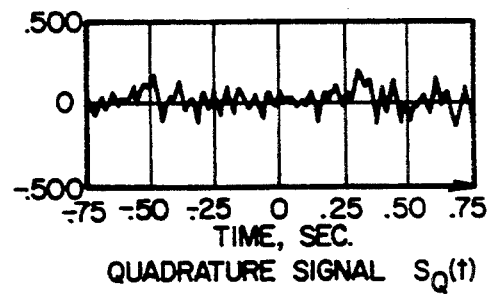
Figure 4C:
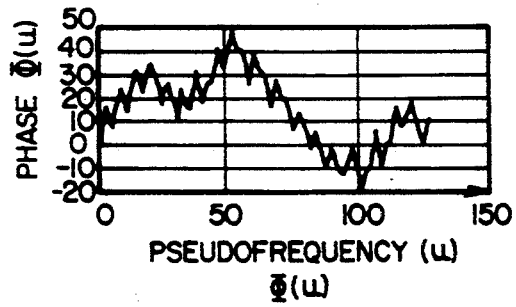
Figure 4F:
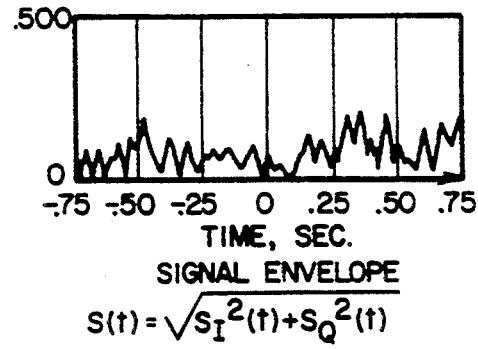

FIG. 4c illustrates the instantaneous phase of the signal output from voltage controlled oscillator (VCO) 35 which is input to the chirp fourier transformer 37. FIGS. 4d and 4e illustrate the in-phase and quadrature components, respectively, output from chirp fourier transformer 37. FIG. 4f illustrates the composite envelope of the signal S(t) formed from the in-phase and quadrature signals illustrated at FIGS. 4d and 4e. FIG. 4f demonstrates the thermal noise-like amplitude characteristics of the output signal generated in accordance with the present invention.

As will be apparent to those of ordinary skill in the art, where the VCO output frequency is pseudo-random with uniform statistical distribution, then the output of the chirp fourier transformer 37 will be pseudo-random with uniform time dispersion. The instantaneous frequency and voltage levels T and −T represent the limits of uniform statistical distribution of S(t).

As previously discussed, various modifications, additions and substitutions may be effected to implement the structure and function of the component portions without departing from the spirit and scope of the invention. For example, other circuitry may be implemented for effecting the signal S(u) input to the chirp fourier transformer. Additionally, the fourier transform function may be implemented by a device other than a chirp fourier transformer. Moreover, adjustment of the circuit parameters may be effected to implement the desired circuit bandwidth and time duration.

What is claimed is:

1. A method of synthesizing a pseudo-random signal having a smooth flat power spectrum comprising:

generating a first signal having a substantially constant amplitude and a frequency varying in a pseudo-ransom manner between two frequency limits, the variation in frequency of said first signal being substantially equally distributed between the two frequency limits over time;

generating a second signal having an amplitude that varies pseudo-randomly and substantially equally between two amplitude limits;

applying said second signal to a voltage controlled oscillator to provide said first signal at the output of said oscillator; and Fourier transforming said first signal to provide said pseudo-random signal.

2. A system for synthesizing a pseudo-random signal having a smooth flat power spectrum comprising:

means for generating a first signal having a substantially constant amplitude and a frequency varying in a pseudo-ransom manner;

means for generating a second signal having an amplitude that varies pseudo-randomly and substantially equally between two amplitude limits;

means for applying said second signal to a voltage controlled-oscillator to provide said first signal at the output of said oscillator; and means for Fourier transforming said first signal to provide said pseudo-random signal.

* * * * *